(12) United States Patent
Lee

(10) Patent No.: US 8,599,569 B2
(45) Date of Patent: Dec. 3, 2013

(54) CIRCUIT BOARD ASSEMBLY STRUCTURE THEREOF

(75) Inventor: Wei-Long Lee, Taipei (TW)

(73) Assignee: Taiwan Oasis Technology Co., Ltd., Taipei (TW)

( * ) Notice: Subject to any disclaimer, the term of this patent is extended or adjusted under 35 U.S.C. 154(b) by 196 days.

(21) Appl. No.: 13/302,156

(22) Filed: Nov. 22, 2011

(65) Prior Publication Data

US 2012/0320543 A1 Dec. 20, 2012

(30) Foreign Application Priority Data

Jun. 17, 2011 (TW) .............................. 100211158 U
Jun. 17, 2011 (TW) .............................. 100211159 U

(51) Int. Cl.
*H05K 5/00* (2006.01)
*H05K 1/14* (2006.01)

(52) U.S. Cl.
CPC .................................... *H05K 1/142* (2013.01)

USPC .......................................... 361/752; 361/756

(58) Field of Classification Search
USPC ............ 361/752, 756, 758; 439/56, 353, 611, 439/419; 362/640, 647, 649
See application file for complete search history.

(56) References Cited

U.S. PATENT DOCUMENTS

| 7,097,463 B2 * | 8/2006 | Hsiao et al. ...................... 439/70 |
| 7,976,210 B2 * | 7/2011 | Shinozaki ..................... 362/631 |
| 8,485,830 B1 * | 7/2013 | Tsai ................................. 439/56 |
| 2012/0212958 A1 * | 8/2012 | Boyer et al. .................. 362/243 |
| 2013/0033851 A1 * | 2/2013 | Wang ............................ 362/101 |

\* cited by examiner

*Primary Examiner* — Yuriy Semenenko
(74) *Attorney, Agent, or Firm* — Jackson IPG PLLC

(57) ABSTRACT

A circuit board assembly structure includes at least a stable fixture, the stable fixture consists a first top clip plate and a first bottom clip plate which can clamp each other and connect to circuit boards in between, then combine the stable fixture to the object to simplify assembly of circuit boards. An extension fixture connects plural extension circuit boards in abutting joint, such that helps modular production.

20 Claims, 11 Drawing Sheets

CIRCUIT BOARD ASSEMBLY STRUCTURE THEREOF

BACKGROUND OF THE INVENTION

1. Field of the Invention

The present invention relates to a circuit board assembly structure thereof, to assemble circuit board to an object quickly, in particular to a circuit board assembly structure can assemble plural number of circuit boards electrically quickly that helps modular production thereof.

2. Description of the Related Art

Heretofore light-emitting diode (LED) is a solid state product, differs from the traditional fluorescent and incandescent lamps, therefore LED lamps will not damage by gas leakage or broken vacuum tube, with the better resistance nature of vibration, swing and wear characters, the usage life of LED lamps is effectively longer.

The product application value of LED increases dramatically, and application areas continue to be developed, in the lighting market, flashlights, searchlight, camping lights, camera flashlights, medical instrument lights, and even outdoor lighting, LED products quickly penetrate into traditional fluorescent and incandescent market.

Therefore, industry general uses modular LED as light source. Most of the modular LED is to have LED's arranged in straight, array or ring shape in a circuit board or metal substrate, and then have the circuit board installed on the lamp main body.

Furthermore some modular LED circuit boards draw varying amount of small boards in advance, and have different amount of LED's on the small boards, by retaining number of small boards on the circuit boards to adjust the number of LED's to achieve different lighting wattages.

Similar circuit boards with adjustment function by retained small boards, but during assembly, changing of the number of small boards might increase assembly and repair cost, even have to change stable apparatus or bracket in different shapes, that not only increases development cost of related fixtures but also increases the production difficulty of modules, that is not easy to lower production, assembly cost.

SUMMARY OF THE INVENTION

In view of the aforementioned problems of the prior art, it is a primary objective of the present invention to provide a circuit board assembly structure thereof, capable of quick assembly of circuit board and the object, even quick assembly a plural circuit boards electrical connection that eases for modular assembly.

To achieve the foregoing objective, the present invention comprising at least a stable fixture; the stable fixture comprises a first top clip plate and a first bottom clip plate which can clamp each other and connect to one end of circuit boards, a plurality number of terminal holes for circuit board connector wire terminals are on both the first top and bottom clip plates corresponding to each other; a conducting slot along each of the terminal holes is on the inner side of the first or second top clip plate to connect conductors.

In principle, only press the first top clip plate and the first bottom clip plate can stable the circuit boards between the first top clip plate and the first bottom clip plate, and connect to conductors, then have stable fixture fix the circuit board to the object, the wire terminals of circuit board pass through terminal holes to connect to the object electrically to finish the assembly quickly. If necessary, the stable fixture and circuit board can be removed from the object, then simply open the first top and bottom clip plates to remove the circuit board from the stable fixture, such that achieves convenient to repair and replace.

Specifically, the present invention produces the following effects:

1. Simple press action can clamp circuit boards between the first top and bottom clip plates of the stable fixture, then combine stable fixture with the object that significantly simplifies the assembly action of the circuit boards.

2. Simple press action can clamp plural number of circuit boards in abutting joint between the second top and bottom clip plates of the stable fixture, then combine stable fixture with the object that significantly simplifies the extension assembly action of plural circuit boards.

3. Simply remove the first top and bottom clip plates of the stable fixture to separate the circuit boards from stable fixture, very convenient to repair and replace circuit boards.

4. Apply the reserved conducting slot and the definite amount of the first, second or third conductors, that quickly connect plural circuitries electrically, simplify modular assembly.

DETAILED DESCRIPTION OF THE PREFERRED EMBODIMENTS

The technical content of the present invention will become apparent by the detailed description of the following embodiments and the illustration of related drawings as follows.

Figure 1:
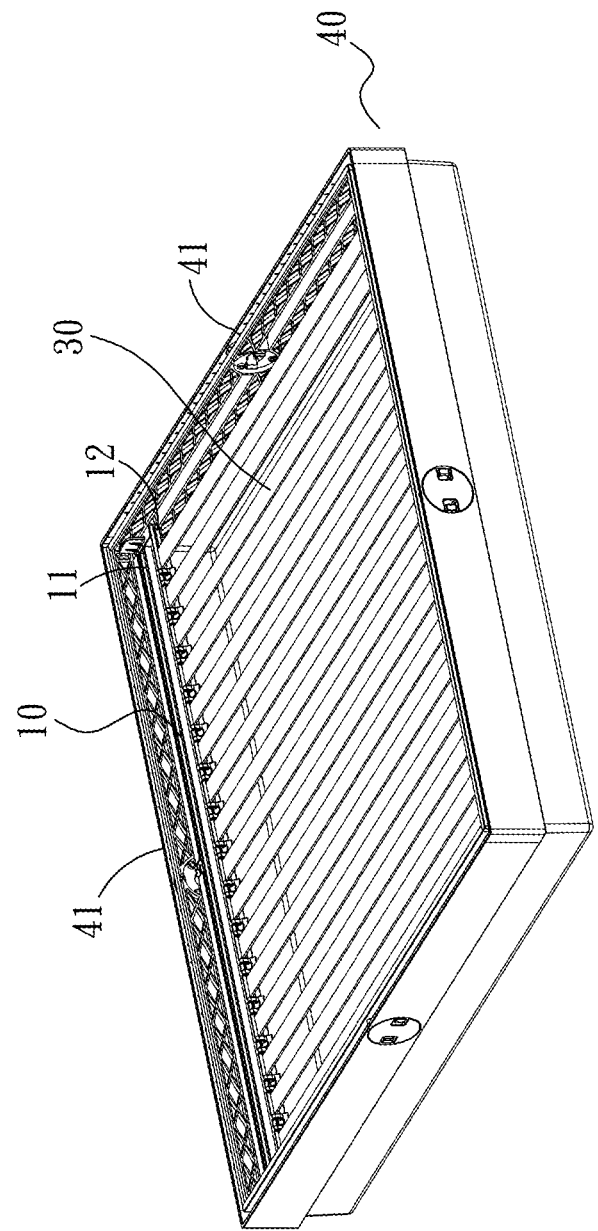
FIG. 1 is a perspective view of a circuit board assembly structure in accordance with the first preferred embodiment of the present invention.
Figure 2:
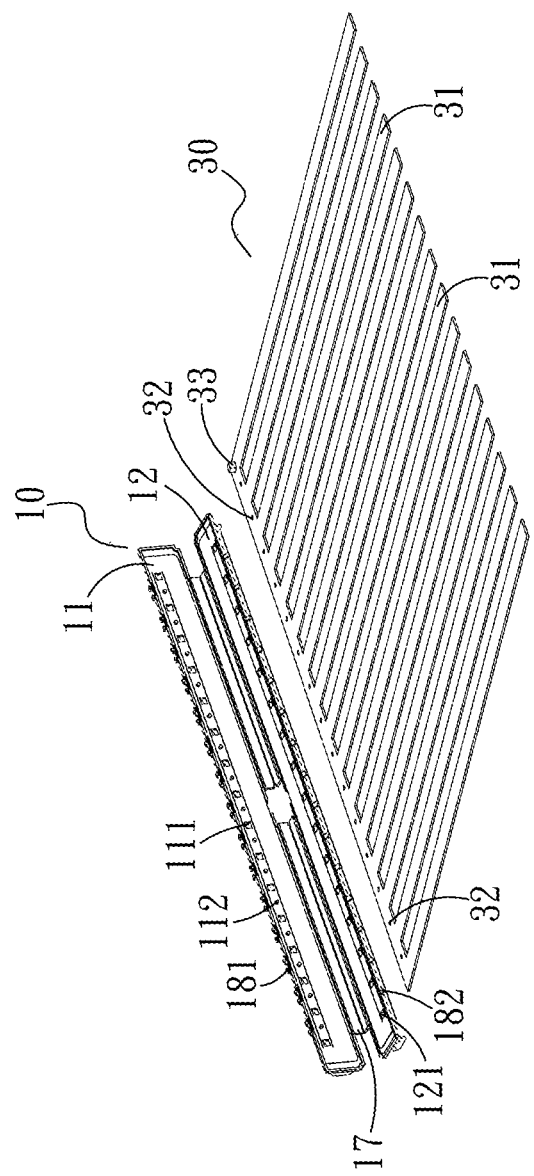
FIG. 2 is an assembly view illustrating open state of the stable fixture of a circuit board assembly structure in accordance with the first preferred embodiment of the present invention.
Figure 3:
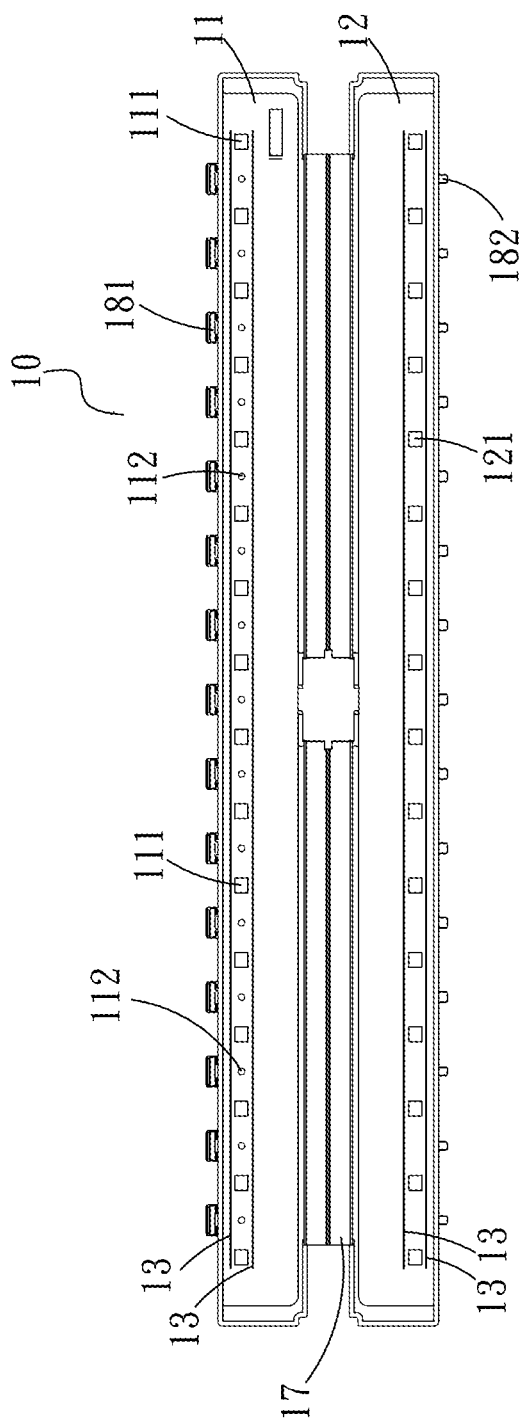
FIG. 3 is a side view illustrating the first top and bottom clip plates of a circuit board assembly structure in accordance with the first preferred embodiment of the present invention.

With reference to FIG. 1, a perspective view of a circuit board assembly structure in accordance with the first preferred embodiment of the present invention, FIG. 2 is a assembly view illustrating open state of the stable fixture of a circuit board assembly structure in accordance with the first preferred embodiment of the present invention, and FIG. 3 is a side view illustrating the first top and bottom clip plates of a circuit board assembly structure in accordance with the first preferred embodiment of the present invention; the present invention comprises at least a stable fixture 10:

The stable fixture 10 consists a first top clip plate 11 and a first bottom clip plate 12 which can clamp each other and connect to one end of circuit boards 30, a plurality number of terminal holes 111, 121 for circuit boards 30 connector wire terminals 33 are on both the first top and bottom clip plates 11, 12 corresponding to each other; a plurality number of positioning pillars 112 corresponding to the positioning holes 32 on the circuit boards 30 are installed on inner side of the first top clip plate 11.

Figure 4:
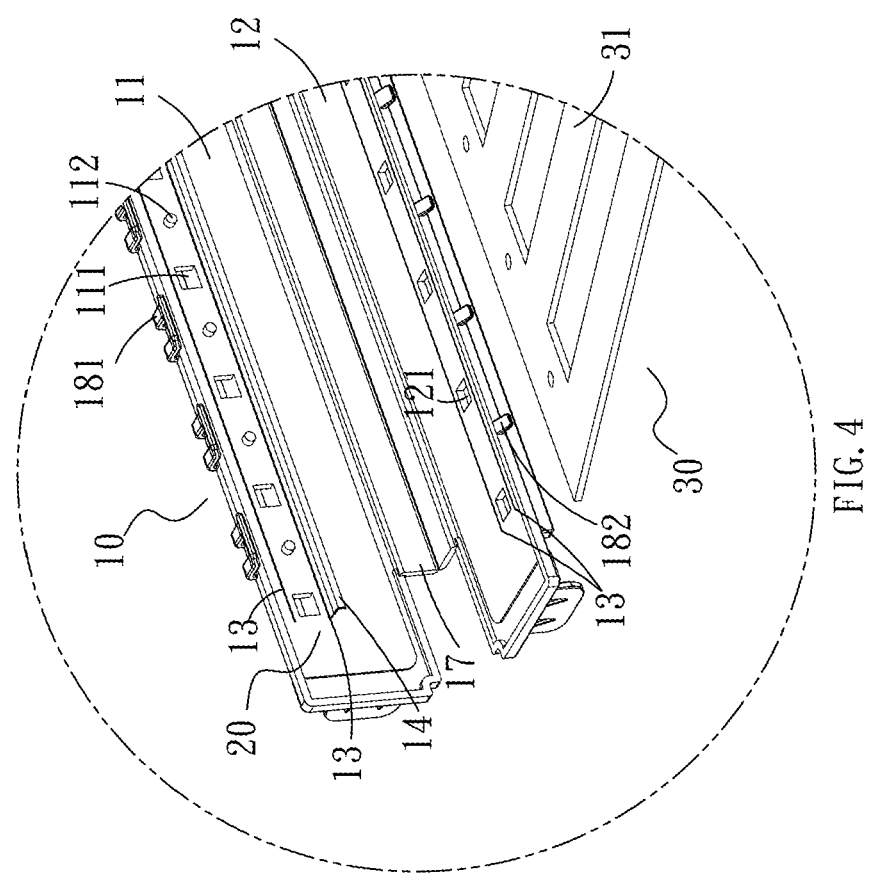
FIG. 4 is an assembly view illustrating the second conductor of a circuit board assembly structure in accordance with the first preferred embodiment of the present invention.

A conducting slot along each of the terminal holes 111, 112 is on the inner side of the first or second top clip plate 11 to connect conductors, as shown in FIG. 4, in this preferred embodiment, a conducting slot 13 along each of the terminal holes 111, 112 is on the inner side of the first top and bottom clip plate 11, 12; a second conductor 14 spanning and plugging over terminal holes 111, 121 is selected to install inside the conducting slot 13 of the first top and bottom clip plate 11, 12 of the stable fixture 10 (as shown in FIG. inside the conducting slot 13 of the first top clip plate 11). The design applies reserved terminal holes 111, 121 and conducting slot 13 to adjust different quantity, location of circuit boards 30, for fast and accurate plural circuit boards 30 electrical connection.

Figure 5:
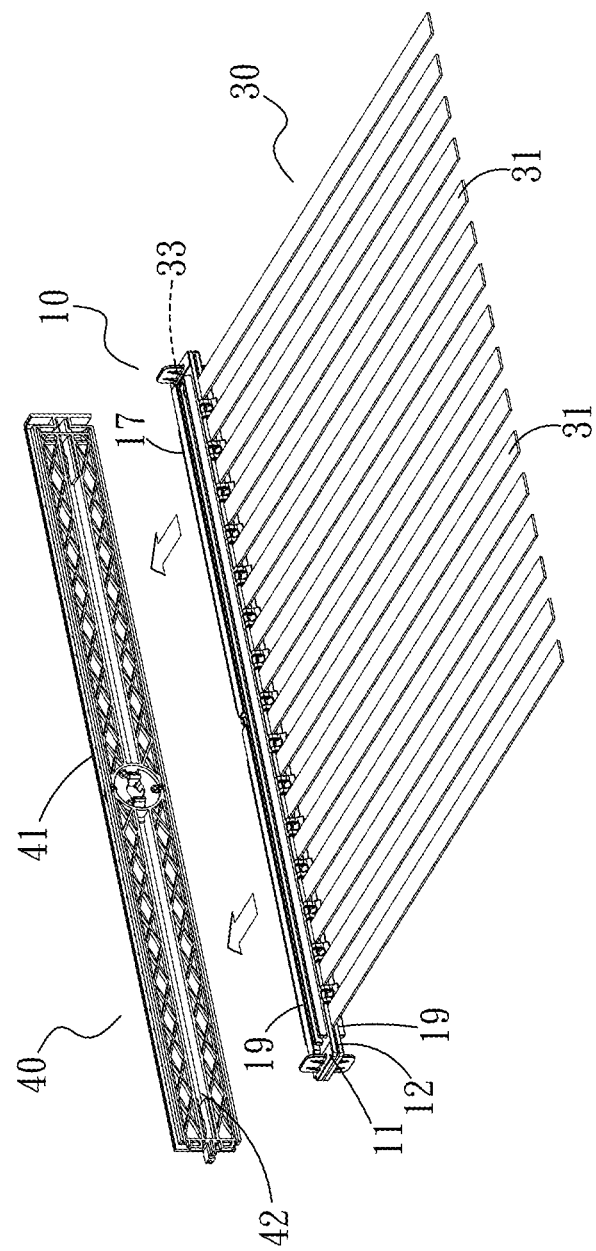
FIG. 5 is an assembly view illustrating the stable fixture of a circuit board assembly structure in accordance with the first preferred embodiment of the present invention.

In principle, the first preferred embodiment of the present invention only needs to plug the positioning pillars 112 on the first top clip plate 11 of the stable fixture 10 into the positioning holes 32 of the circuit board 30 and simply press the first top clip plate and the first bottom clip plate 11, 12 to stable the circuit boards 30 between the first top and bottom clip plates 11, 12 of the stable fixture 10. As shown in FIG. 5, at least one stable fixture 10 combines circuit board 30 and the object 40, wire terminals 33 of the circuit board 30 pass through terminal holes 111 and electrically connect to the object 40 (lamps), such that achieves purpose of quick assembly of circuit boards 30 and the object 40.

When necessary, the stable fixture 10 along with circuit board 30 can be removed from the object 40, and open the first top and bottom clip plates 11, 12 to remove circuit boards 30 from the stable fixture 10, very convenient to repair and replace circuit boards 30. In above FIG., a trough 42 in the inner side of the inlay 41 to joint circuit boards 30 is on the object 40 (lamp), the first top and bottom clip plates 11, 12 apply the trough 42 to combine circuit boards 30 and the object 40 (lamp).

Figure 6:
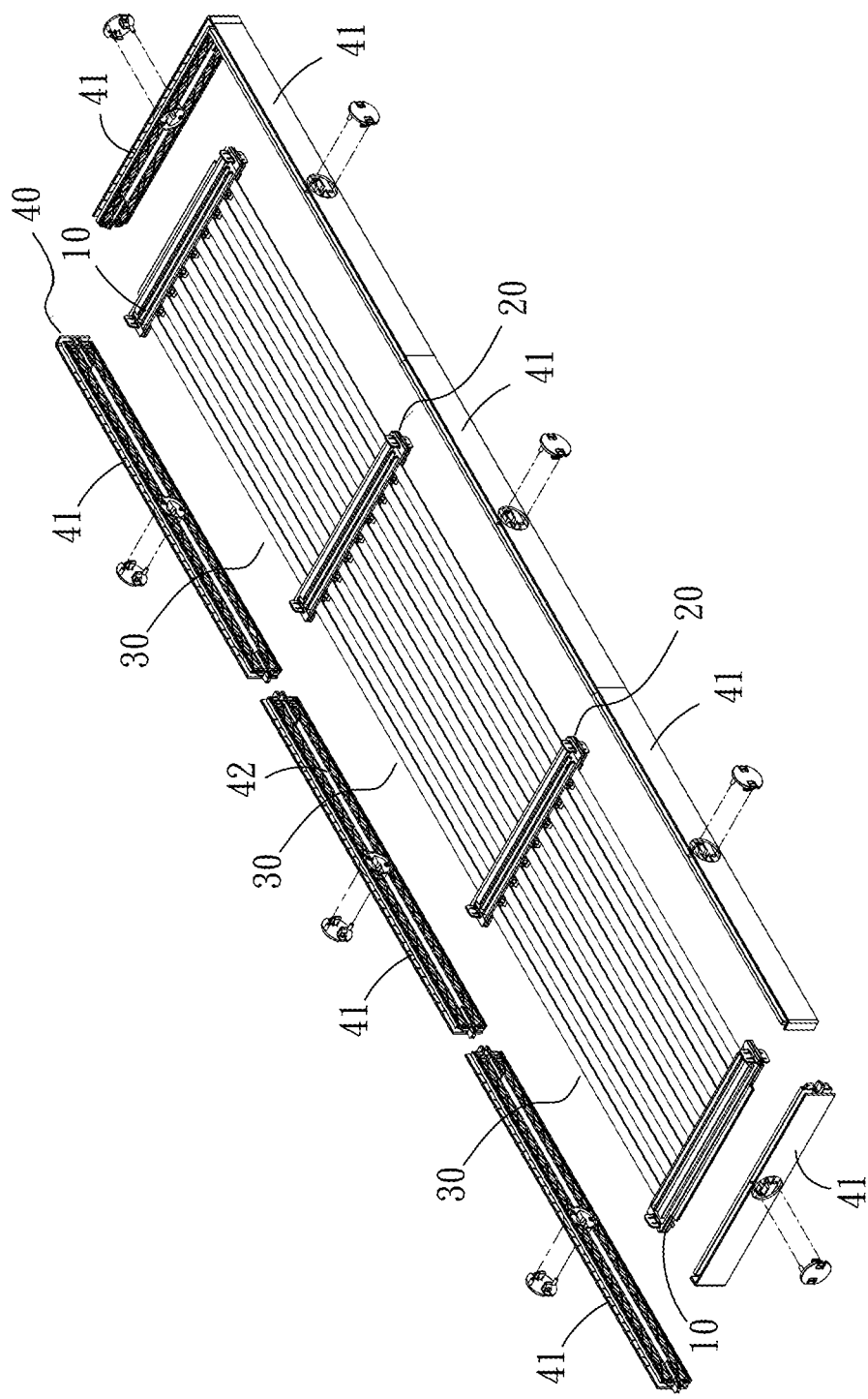
FIG. 6 is an assembly view of a circuit board assembly structure in accordance with the second preferred embodiment of the present invention.
Figure 7:
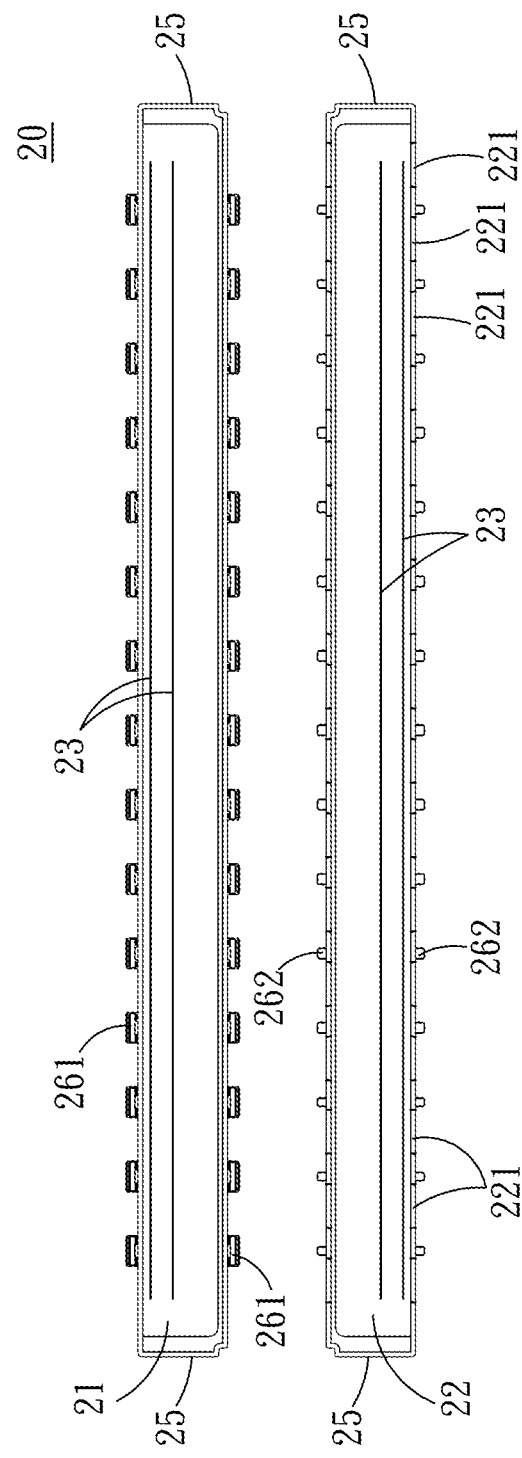
FIG. 7 an structure view illustrating inner side of the second top, bottom clip plates of a circuit board assembly structure in accordance with the second preferred embodiment of the present invention.

Refer to FIG. 6, an assembly view of a circuit board assembly structure in accordance with the second preferred embodiment of the present invention, FIG. 7 an structure view illustrating inner side of the second top, bottom clip plates of a circuit board assembly structure in accordance with the second preferred embodiment of the present invention; the present invention further consists a extension fixture 20:

The extension fixture 20 consists a second top clip plate 21 and a second bottom clip plate 22 which can clamp each other, plural number of circuit board troughs 221 with open ends for circuit boards 30 are in the inner side of the second bottom clip plate 22; at least one guide slot 23 stretching to all circuit board troughs 221 is inside the second top and bottom clip plates 21, 22.

Figure 8:
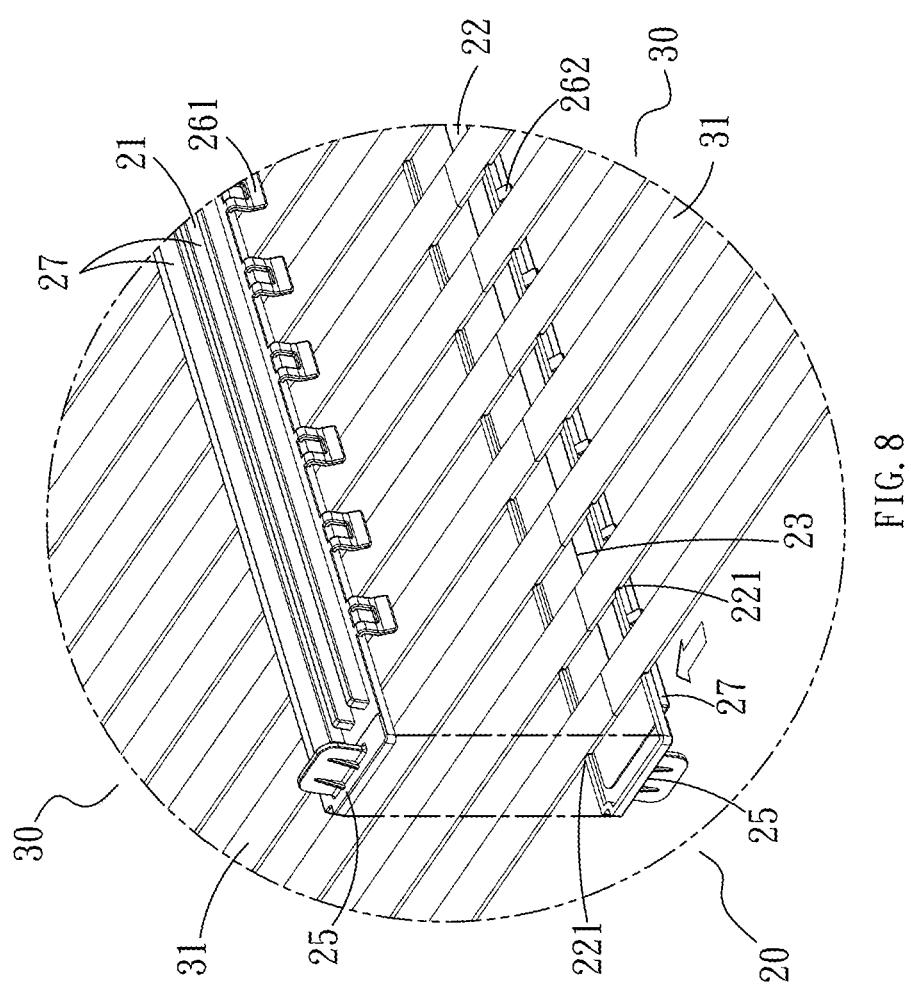
FIG. 8 is an assembly view of the extension fixture and circuit boards of a circuit board assembly structure in accordance with the second preferred embodiment of the present invention.
Figure 9:
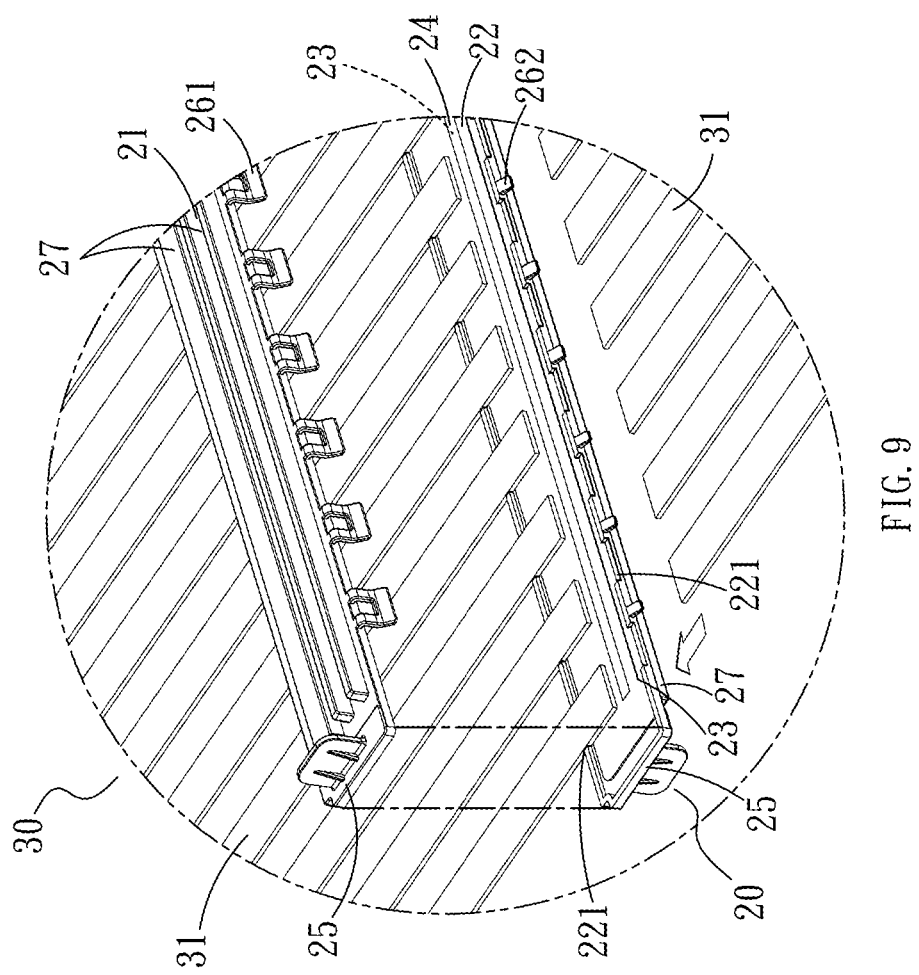
FIG. 9 is another assembly view of the extension fixture and circuit boards of a circuit board assembly structure in accordance with the second preferred embodiment of the present invention.

As shown in FIG. 8, while application of the extension fixture 20, plural circuit boards 30 (the small boards 31 of the circuit board 30 shown in FIG.) are fastened between corresponding second top clip plate 21 and second bottom clip plate 22 in abutting joint for quick extension assembly action of plural circuit boards 30. As shown in FIG. 9, a first conductor 24 spanning and plugging over conducting slot is selected to install inside the circuit board troughs 221 of the second top and bottom clip plate 21, 22 of the extension fixture 20, at least one of the first conductor 24 connects to the plural circuit boards 30 fixed between the second top and bottom clip plates 21, 22 electrically. (as shown in FIG. the small boards 31 of the circuit board 30).

Figure 10:
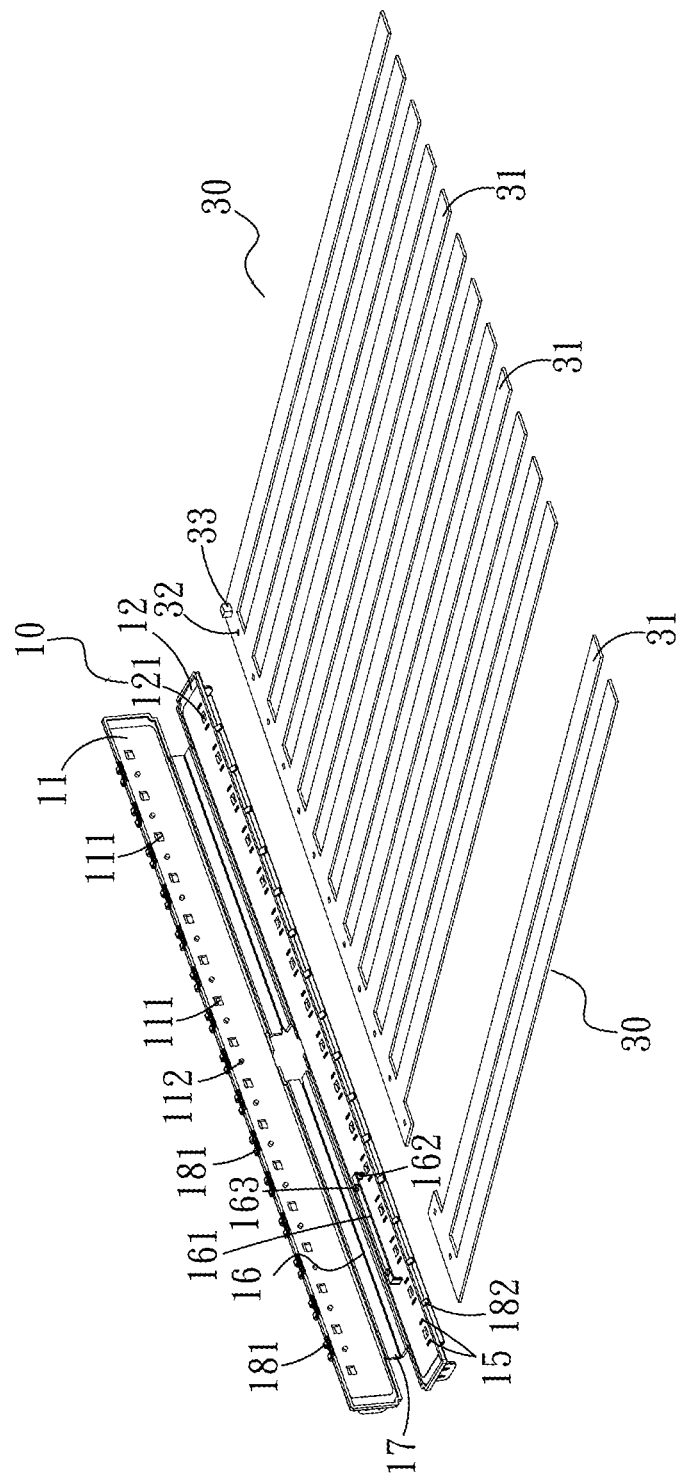
FIG. 10 is an assembly view of the third conductor of a circuit board assembly structure in accordance with the fourth preferred embodiment of the present invention.
Figure 11:
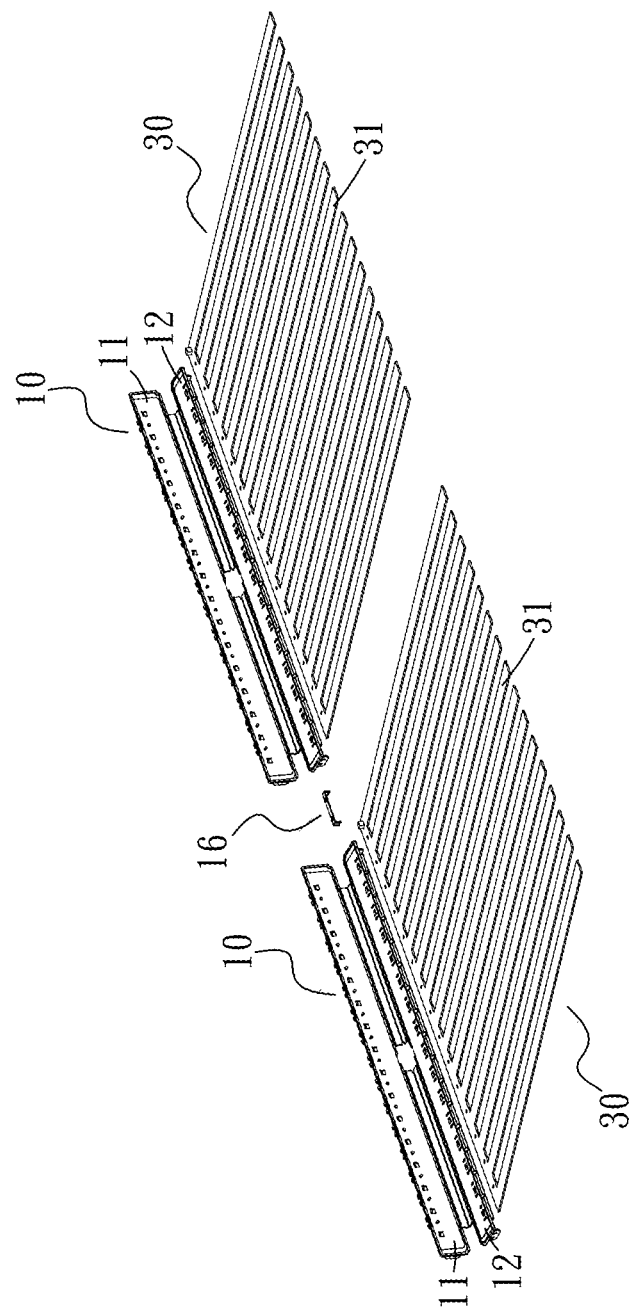
FIG. 11 is another assembly view of the third conductor of a circuit board assembly structure in accordance with the fourth preferred embodiment of the present invention.

The present invention also applies to circuit boards 30 with small boards 31 adjustment function; as shown in FIG. 10 and FIG. 11, plural number of conductor slots 15 in interval configuration with terminal holes 121 are installed in the inner side of the first bottom clip plate 12 of the stable fixture 10; a least one stable fixture further comprises at least one third conductor 16.

The third conductor 16 comprises a conductor body 161 can be housed in the first top and bottom clip plate 11, 12, both ends of the conductor body 161 have a plug 162 to connect to the conduct trough 15 of the first bottom clip plate 12; an electrode 163 to connect to the circuit boards 30 is on both ends of the conductor body 161 of the third conductor 16.

When necessary, as shown in FIG. 10, definite number of the third conductors 16 are placed between the first top and bottom clip plates 11, 12 of the same stable fixture 10 to connect circuit boards 30 within the same stable fixture 10, or as shown in FIG. 12, the third conductor 16 spans over and connects to the first top clip plate 11 and the bottom clip plate 12 of two adjacent stable fixtures 10 to conduct circuit boards 30 between two adjacent stable fixtures 10.

Apply the reserved conducting slot and the definite amount of the first, second or third conductors, that quickly connect plural circuitries electrically, simplify modular assembly and production.

In above preferred embodiments, the first top and bottom clip plates 11, 12 of the stable fixture 10 are preferred to be manufactured in the integrated mold, as shown in FIG. 3 and FIG. 5, one side of the first top and bottom clip plates 11, 12 that connects to the object 40 is manufactured with mold and formed a first inlay 17 for the object 40; plural number of corresponding buckle ears 181 and convex buckles 182 are on the first top and bottom clip plates 11, 12 facing circuit boards 30, to fasten the first top and bottom clip plates 11, 12 of the stable fixture 10 firmly.

As shown in FIG. 9, the second top and bottom clip plates 21, 22 of the extension fixture 20 are preferred to be independent body, two ends of the second top and bottom clip plates 21, 22 form a second inlay 25 for the object 40; plural number of buckle ears 261 are on the front and rear of the second top clip plates 21 of the extension fixture 20, plural number of convex buckles 262 corresponding to buckle ears 261 are on the front and rear of the second bottom clip plates 22, such that the simple buckle action of convex buckles 262 and buckle ears 261 can connect the second top and bottom clip plates 21, 22 firmly together.

The preferred embodiment shown from FIG. 6 to FIG. 9, plural number of enforcements 27 are on the second top and bottom clip plates 21, 22 of the extension fixture 20; while application, the enforcements 27 are formed by the convex strip outside the second top clip plate 21, to enforce the structure strength of the extension fixture 20.

As shown in FIG. 5, plural number of enforcements 19 are on the first top and bottom clip plates 11, 12 of the stable fixture 10; while application, the enforcements 19 are formed by the convex strip outside the first top clip plate 11, to enforce the structure strength of the extension fixture 10.

Compare to prior structure, the preferred embodiments of a circuit board assembly structure in accordance to the present invention apply simple press action can clamp circuit boards between the first top and bottom clip plates of the stable fixture, then combine stable fixture with the object, that significantly simplifies the assembly action of the circuit boards; similarly apply simple press action can clamp plural number of circuit boards in abutting joint between the second top and bottom clip plates of the stable fixture, then combine stable fixture with the object, that significantly simplifies the extension assembly action of plural circuit boards. Simply remove the first top and bottom clip plates of the stable fixture to separate the circuit board from stable fixture, very convenient to repair and replace circuit boards. Apply the reserved conducting slots and the definite amount of the first, second or third conductors, that quickly connect plural circuitries electrically, simplify modular assembly.

While preferred embodiments of the invention have been shown and described in detail, it will be readily understood and appreciated that numerous omissions, changes and additions may be made without departing from the spirit and scope of the invention.

What is claimed is:

1. A circuit board assembly structure, comprising at least one stable fixture; said stable fixture comprises a first top clip plate and a first bottom clip plate which can clamp each other and connect to circuit boards, a plurality number of terminal holes for circuit board connector wire terminals are on both said first top and bottom clip plates corresponding to each other; a conducting slot along each of said terminal holes is on the inner side of said first or second top clip plate to connect conductors.

2. The circuit board assembly structure of claim 1, wherein an extension fixture comprises a second top clip plate and a second bottom clip plate which can clamp each other, plural number of circuit board troughs with open ends for circuit boards are in the inner side of said second bottom clip plate; at least one guide slot stretching to all said circuit board troughs is inside said second top and bottom clip plates.

3. The circuit board assembly structure of claim 2, wherein a first conductor is selected to install inside the troughs of said second top clip plate or said bottom clip plate.

4. The circuit board assembly structure of claim 2, wherein plural number of buckle ears are on the front and rear of said second top clip plates of said extension fixture, plural number of convex buckles corresponding to said buckle ears are on the front and rear of said second bottom clip plates; two ends of said second top and bottom clip plates form a second inlay for the object.

5. The circuit board assembly structure of claim 2, wherein plural number of enforcements are on said second top and bottom clip plates.

6. The circuit board assembly structure of claim 1, wherein a conducting slot along each of said terminal holes is on the inner side of said first top and bottom clip plate to connect conductors; a second conductor is selected to install inside said conducting slot of said first top and bottom clip plates.

7. The circuit board assembly structure of claim 1, wherein plural number of conductor slots in interval configuration with said terminal holes are installed in the inner side of said first bottom clip plate of said stable fixture; a least one said stable fixture further comprises at least one third conductor.

8. The circuit board assembly structure of claim 7, wherein said third conductor comprises a conductor body can be housed in said first top and bottom clip plate, both ends of said conductor body have a plug to connect to said conduct trough of said first bottom clip plate; an electrode to connect to said circuit boards is on both ends of said conductor body of said third conductor.

9. The circuit board assembly structure of claim 8, wherein said conductor body is in slice structure with connection on both ends.

10. The circuit board assembly structure of claim 1, wherein one side of said first top and bottom clip plates that connects to the object is manufactured with mold and formed a first inlay for the object; plural number of corresponding buckle ears and convex buckles are on said first top and bottom clip plates facing circuit boards.

11. The circuit board assembly structure of claim 1, wherein plural number of enforcements are on said first top and bottom clip plates of said stable fixture.

12. The circuit board assembly structure of claim 1, wherein a plurality number of positioning pillars corresponding to the positioning holes on the circuit board are installed on inner side of said first top clip plate.

13. The circuit board assembly structure of claim 1, wherein a trough in the inner side of said inlay to joint circuit board is on the object, said first top and bottom clip plates are inserted to said trough.

14. A circuit board assembly structure, comprising at least:
at least one extension fixture with a first top clip plate and a first bottom clip plate which can clamp each other;
said first top clip plates has a plurality number of terminal holes for circuit board connector wire terminals; a conducting slot along each of said terminal holes is on the inner side of said first top clip plate;
said first bottom clip plates has a plurality number of terminal holes for circuit board connector wire terminals corresponding to said first top clip plate; a conducting slot along each of said terminal holes is on the inner side of said first bottom clip plate; and
at least one second conductor is selected to install inside the conducting slot of said first top or bottom clip plate and spans over said terminal holes.

15. The circuit board assembly structure of claim 14, wherein an extension fixture comprises a second top clip plate and a second bottom clip plate which can clamp each other, plural number of circuit board troughs with open ends for circuit boards are in the inner side of said second bottom clip plate; at least one guide slot stretching to all said circuit board troughs is inside said second top and bottom clip plates.

16. The circuit board assembly structure of claim 15, wherein a first conductor is selected to install inside the troughs of said second top clip plate or said bottom clip plate.

17. A circuit board assembly structure, comprising at least:
at least one extension fixture with a first top clip plate and a first bottom clip plate which can clamp each other;
said first top clip plates has a plurality number of terminal holes for circuit board connector wire terminals; a conducting slot along each of said terminal holes is on the inner side of said first top clip plate;
said first bottom clip plates has a plurality number of terminal holes for circuit board connector wire terminals corresponding to said first top clip plate; a conducting slot along each of said terminal holes is on the inner side of said first bottom clip plate; and at least one third conductor is selected to install inside the conducting slot of said first top or bottom clip plate and spans over said terminal holes.

18. The circuit board assembly structure of claim 17, wherein an extension fixture comprises a second top clip plate and a second bottom clip plate which can clamp each other, plural number of circuit board troughs with open ends for circuit boards are in the inner side of said second bottom clip plate; at least one guide slot stretching to all said circuit board troughs is inside said second top and bottom clip plates.

19. The circuit board assembly structure of claim 16, wherein a first conductor is selected to install inside the troughs of said second top clip plate or said bottom clip plate.

20. The circuit board assembly structure of claim 17, wherein said third conductor comprises a conductor body can be housed in said first top and bottom clip plate, both ends of said conductor body have a plug to connect to said conduct trough of said first bottom clip plate; an electrode to connect to said circuit boards is on both ends of said conductor body of said third conductor.

* * * * *